(12) United States Patent
Lin et al.

(10) Patent No.: US 12,165,978 B2
(45) Date of Patent: Dec. 10, 2024

(54) PACKAGE STRUCTURE AND METHOD OF MANUFACTURING THE SAME

(71) Applicant: Taiwan Semiconductor Manufacturing Company, Ltd., Hsinchu (TW)

(72) Inventors: Shih-Ting Lin, Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/982,519

(22) Filed: Nov. 8, 2022

(65) Prior Publication Data

US 2023/0089263 A1    Mar. 23, 2023

Related U.S. Application Data

(63) Continuation of application No. 16/718,219, filed on Dec. 18, 2019, now Pat. No. 11,574,872.

(51) Int. Cl.
| | |
|---|---|
| *H01L 23/538* | (2006.01) |
| *H01L 21/56* | (2006.01) |
| *H01L 21/683* | (2006.01) |
| *H01L 23/00* | (2006.01) |
| *H01L 23/14* | (2006.01) |
| *H01L 23/29* | (2006.01) |
| *H01L 23/31* | (2006.01) |
| *H01L 23/373* | (2006.01) |
| *H01L 23/498* | (2006.01) |

(Continued)

(52) U.S. Cl.
CPC ........ *H01L 23/5381* (2013.01); *H01L 21/565* (2013.01); *H01L 21/568* (2013.01); *H01L 21/6835* (2013.01); *H01L 23/295* (2013.01); *H01L 23/3128* (2013.01); *H01L 23/3135* (2013.01); *H01L 23/49816* (2013.01); *H01L 23/5384* (2013.01); *H01L 23/5386* (2013.01); *H01L 25/0655* (2013.01); *H01L 25/50* (2013.01); *H01L 2221/68359* (2013.01)

(58) Field of Classification Search
CPC ............. H01L 25/0655; H01L 23/5318; H01L 23/3135; H01L 23/295; H01L 23/5381
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Antonio B Crite
(74) *Attorney, Agent, or Firm* — JCIPRNET

(57) ABSTRACT

Package structure and method of manufacturing the same are provided. The package structure includes a first die, a second die, a first encapsulant, a third die, and a second encapsulant. The first die and the second die laterally aside the first die. The first encapsulant laterally encapsulates the first die and the second die. The third die is electrically connected to the first die and the second die. The second encapsulant is over the first die, the second die and the first encapsulant, laterally encapsulating the third die. The first encapsulant includes a plurality of first fillers, the second encapsulant includes a plurality of second fillers, and a content of the second fillers in the second encapsulant is less than a content of the first fillers in the first encapsulant.

20 Claims, 13 Drawing Sheets

(51) Int. Cl.
*H01L 25/00* (2006.01)
*H01L 25/065* (2023.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2019/0181092 A1* | 6/2019 | Hsiung ............... H01L 23/5386 |
| 2020/0294964 A1* | 9/2020 | Min ..................... H01L 23/295 |

\* cited by examiner

PACKAGE STRUCTURE AND METHOD OF MANUFACTURING THE SAME

CROSS-REFERENCE TO RELATED APPLICATION

This application is a continuation application of and claims the priority benefit of a prior application Ser. No. 16/718,219, filed on Dec. 18, 2019. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

DETAILED DESCRIPTION

Figure 1A:
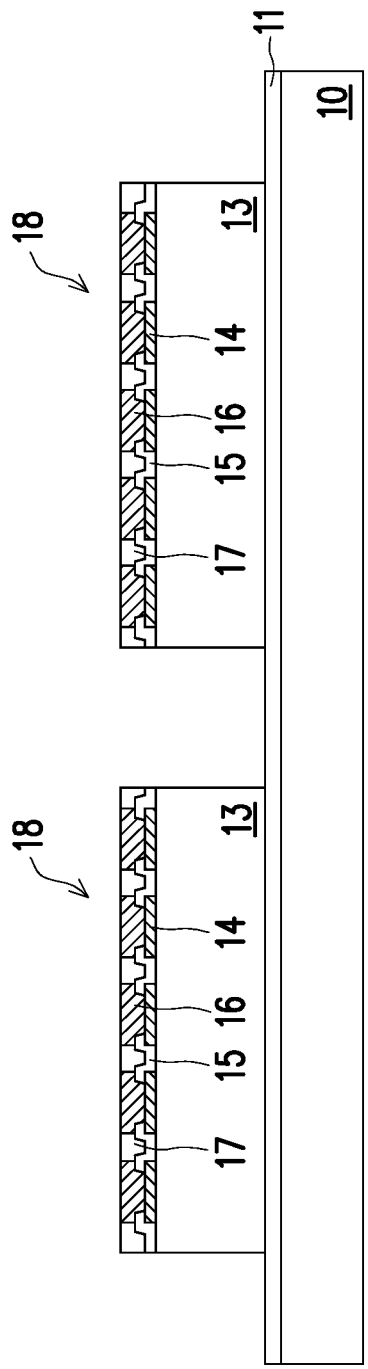
FIG. 1A to FIG. 1J are schematic cross-sectional views illustrating a method of forming a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Underfill filling process and molding process are usually used in combination for encapsulating a semiconductor die (especially for a flip-chip die or a bridge die) in conventional packaging process. For example, an underfill filling process is firstly performed to form an underfill layer under the semiconductor die to fill the space between the semiconductor die and another semiconductor device to which the semiconductor die is connected, and the connectors providing the electrical connection between the semiconductor die and the semiconductor device is surrounded and protected by the underfill layer. The semiconductor die may then be grinded to have a reduced thickness by a first grinding process. Thereafter, an over-molding process is performed to form a molding compound encapsulating the semiconductor die and the underfill layer, and a second grinding process is performed to remove excess molding compound, so as to expose the semiconductor die and/or through vias which may be disposed around the semiconductor die.

In the conventional packaging process, underfill filling process and molding process are separately performed and two grinding processes are needed to form the encapsulated semiconductor die, which is a complex process flow requiring a high manufacturing cost and having a high risk of process control. On the other hand, in the embodiments in which through vias are formed around the die, the underfill layer may flow to reach and nonuniformly contact the through vias, which may negatively impact the reliability of the resulted package structure. Currently, a solution to such issue is to define a keep out zone (KoZ) around the semiconductor die, the keep out zone is a region where no through vias or other components can be disposed within. However, the setting of the keep out zone would further increase the complexity and the cost of the manufacturing process, and would also increase the size of the resulted package. Another challenge with the above packaging process is defining a fine keep out zone and controlling the underfill filling process such that the underfill layer would not flow out of the keep out zone to reach the through vias. In other word, the conventional packaging process is complex and the cost is high, and the yield (wafer per hour (WPH)) is relatively low.

In various embodiments, the disclosure is directed to provide a semiconductor package and a manufacturing process thereof which need less process steps and lower cost, and there is no need to set a keep out zone around the semiconductor die.

FIG. 1A to FIG. 1L are schematic cross-sectional views illustrating a method of manufacturing a package structure according to some embodiments of the disclosure.

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

Still referring to FIG. 1A, a plurality of dies 18 are mounted over the carrier 10 by pick and place processes. In some embodiments, the dies 18 are attached side by side to the de-bonding layer 11 over the carrier 10 through an adhesive layer (not shown) such as a die attach film (DAF), silver paste, or the like. The dies 18 may respectively be an application-specific integrated circuit (ASIC) chip, an analog chip, a sensor chip, a wireless and radio frequency chip, a voltage regulator chip or a memory chip. The dies 18 may be the same types of dies or the different types of dies. In some embodiments, the dies 18 are small die partitions with different function of a larger single die. It is noted that, the number of the dies 18 shown in the figures are merely for illustration, and the disclosure is not limited thereto. In some embodiments, the height (i.e. thickness) H1 of the die 18 ranges from 600 μm to 700 μm, for example.

In some embodiments, the die 18 includes a substrate 13, a plurality of pads 14, a passivation layer 15, a plurality of connectors 16 and a passivation layer 17. In some embodiments, the substrate 13 is made of silicon or other semiconductor materials. Alternatively or additionally, the substrate 13 includes other elementary semiconductor materials such as germanium, gallium arsenic, or other suitable semiconductor materials. In some embodiments, the substrate 13 may further include other features such as various doped regions, a buried layer, and/or an epitaxy layer. Moreover, in some embodiments, the substrate 13 is made of an alloy semiconductor such as silicon germanium, silicon germanium carbide, gallium arsenic phosphide, or gallium indium phosphide. Furthermore, the substrate 13 may be a semiconductor on insulator such as silicon on insulator (SOI) or silicon on sapphire.

In some embodiments, a plurality of devices are formed in and/or on the substrate 13. In some embodiments, the devices may be active devices, passive devices, or combinations thereof. In some embodiments, the devices are integrated circuit devices. The devices are, for example, transistors, capacitors, resistors, diodes, photodiodes, fuse devices, or the like, or combinations thereof.

In some embodiments, an interconnection structure and a dielectric structure are formed over the substrate 13. The interconnection structure is formed in the dielectric structure and connected to different devices to form a functional circuit. In some embodiments, the dielectric structure includes an inter-layer dielectric layer (ILD) and one or more inter-metal dielectric layers (IMD). In some embodiments, the interconnection structure includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to be connected to the metal lines in different layers.

The pads 14 may be or electrically connected to a top conductive feature of the interconnection structure, and further electrically connected to the devices formed on the substrate 13 through the interconnection structure. The material of the pads 14 may include metal or metal alloy, such as aluminum, copper, nickel, or alloys thereof.

The passivation layer 15 is formed over the substrate 13 and covers a portion of the pads 14. A portion of the pads 14 is exposed by the passivation layer 15 and serves as an external connection of the die 18. The connectors 16 are formed on and electrically connected to the pads 14 not covered by the passivation layer 15. The connectors 16 includes solder bumps, gold bumps, copper bumps, copper posts, copper pillars, or the like, or combinations thereof. The passivation layer 17 is formed over the passivation layer 15 and laterally aside the connectors 16 to cover the sidewalls of the connectors 16. The passivation layers 15 and 17 respectively include an insulating material such as silicon oxide, silicon nitride, polymer, or a combination thereof. The polymer may include polybenzoxazole (PBO), polyimide (PI), benzocyclobutene (BCB), the like, or combinations thereof. The materials of the passivation layer 15 and the passivation layer 17 may be the same or different. In some embodiments, the top surface of the passivation layer 17 and the top surfaces of the connectors 16 are substantially coplanar with each other.

Figure 1B:
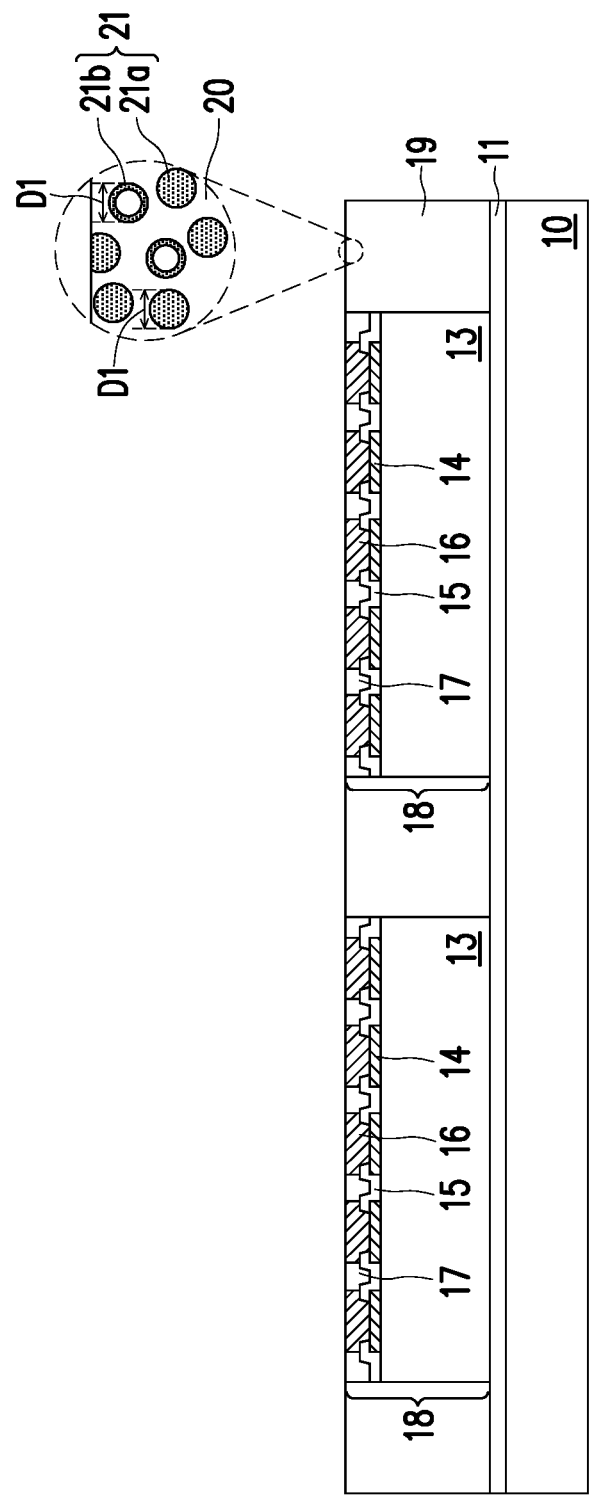

Referring to FIG. 1B, an encapsulant 19 is formed over the carrier 10 to laterally encapsulate sidewalls of the dies 18. In some embodiments, the encapsulant 19 includes a molding compound, a molding underfill, a resin such as epoxy, a combination thereof, or the like. In some other embodiments, the encapsulant 19 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 19 includes nitride such as silicon nitride, oxide such as silicon oxide, phosphosilicate glass (PSG), borosilicate glass (BSG), boron-doped phosphosilicate glass (BPSG), a combination thereof, or the like.

In some exemplary embodiments, the encapsulant 19 is a molding compound which is a composite material including a base material 20 and a plurality of fillers 21 in the base material 20. In some embodiments, the encapsulant 19 may further include additives, such as hardener. The base material 20 may include resins, such as epoxy resins, phenolic resins or silicon-containing resins, or anhydride and amine resins or the like or combinations thereof. The fillers 21 may include a single element, a compound such as nitride, oxide, or a combination thereof. The fillers 21 may include silicon oxide, aluminum oxide, boron nitride, alumina, silica, or the like, for example. In some embodiments, the fillers 21 are spherical particles, or the like. The cross-section shape of the filler 21 may be circle, oval, or any other shape. In some embodiments, the fillers 21 include solid fillers, such as the illustrated fillers 21a, but the disclosure is not limited thereto. In some embodiments, a small portion of the fillers 21 may be hollow fillers, such as the fillers 21b shown in FIG. 1B.

In some embodiments, the filler size and filler content of the encapsulant 19 are controlled in a suitable range, and suitable base material and additives are selected to form the encapsulant 19, such that the encapsulant 19 has a good property to provide the encapsulation of the dies 18. For example, the filler size (e.g. diameter D1), such as the maximum filler size of the filler 21 may be in the range of 10 μm to 25 μm or 10 μm to 30 μm. The average filler size (e.g. diameter D1) of the filler 21 may be in the range of 5 μm to 15 μm. In some embodiments, based on the total weight of the encapsulant 19, the content of the fillers 21 in the encapsulant 19 is larger than 80 wt %, such as 80 wt % to 90 wt % or more. The thermal expansion coefficient (CTE) of the encapsulant 19 is 5 ppm/° C. to 15 ppm/° C. in a temperature range under glass transition temperature (Tg), and 25 ppm/° C. to 50 ppm/° C. in a temperature range higher than Tg, for example. The viscosity of the encapsulant 19 ranges from 80 Pa·s to 300 Pa·s at room temperature, and greater than 1 Pa·s at a temperature range of 50° C. to 100° C. Herein, the viscosity of the encapsulant refers to the viscosity of the encapsulant material used to form the encapsulant before the encapsulant material is cured. The Young's Modulus of the encapsulant 19 ranges from 15 Gpa to 30 Gpa at room temperature.

In some embodiments, the encapsulant 19 is formed by the following processes: an encapsulant material layer is formed over the carrier 10 by an over-molding process, so as to encapsulate sidewalls and top surfaces of the dies 18. A curing process is then performed to cure the encapsulant material layer. Thereafter, a planarization process is performed to remove a portion of the encapsulant material layer over the top surfaces of the dies 18, such that the connectors 16 of the dies 18 are exposed. The planarization process may include a grinding process, a polishing process such as a chemical mechanical polishing (CMP) process, or a combination thereof. In some embodiments, the top surface of the encapsulant 19 is substantially coplanar with the top surfaces (that is, active surfaces) of the dies 18.

Figure 1C:
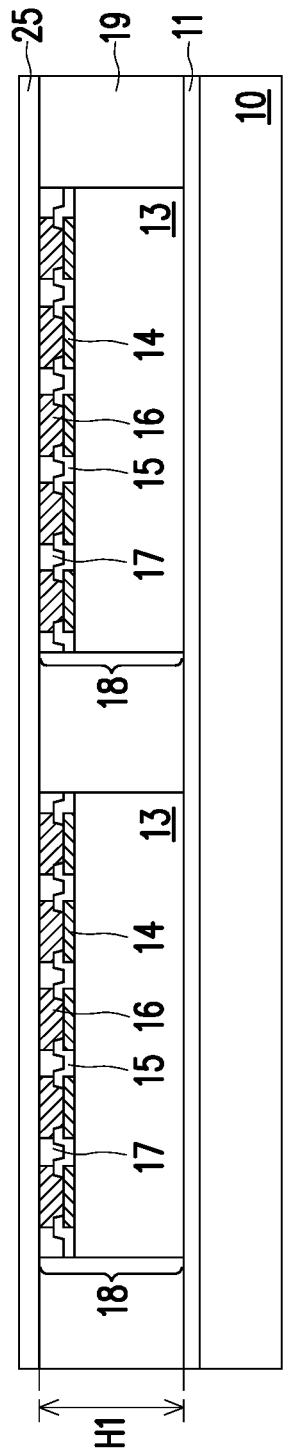

Referring to FIG. 1C, a dielectric layer 25 is then formed on the encapsulant 19 and the dies 18, so as to cover the top surfaces of the dies 18 and the top surface of the encapsulant 19. The dielectric layer 25 may be a single layer or a multilayer structure. The material of the dielectric layer 25 includes an inorganic dielectric material, an organic dielectric material, or a combination thereof. The inorganic dielectric material is, for example, silicon oxide, silicon nitride, silicon oxynitride, or a combination thereof. The organic dielectric material includes polymer. The polymer includes a photosensitive material, a non-photosensitive material, or a combination thereof. In some embodiments, the photosensitive material includes photosensitive polybenzoxazole (PBO), polyimide (PI), benzocyclobutene (BCB), a combination thereof, and/or the like. The non-photosensitive material includes Ajinomoto buildup film (ABF). The dielectric layer 20 may be formed by chemical vapor deposition, spin coating, lamination, or the like, or a combination thereof.

Figure 1D:
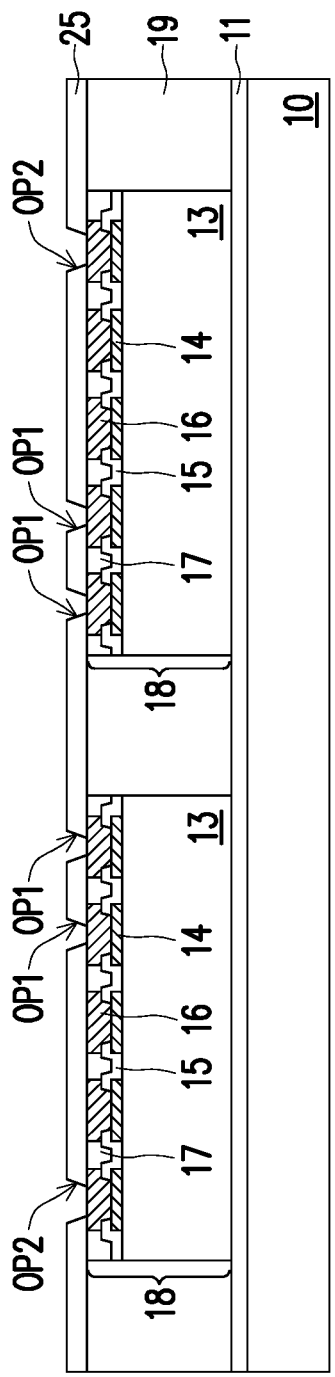

Referring to FIG. 1D, the dielectric layer 25 is patterned to form a plurality of openings OP1 and OP2 therein by photolithograph and etching processes or laser processes. The openings OP1 and OP2 respectively expose a portion of the top surface of a corresponding connector 16 of the die 18. The sizes of the openings OP1 and OP2 may be the same as or different from each other. In some embodiments, the size of the opening OP1 is less than the size of the opening OP2. However, the disclosure is not limited thereto.

Figure 1E:
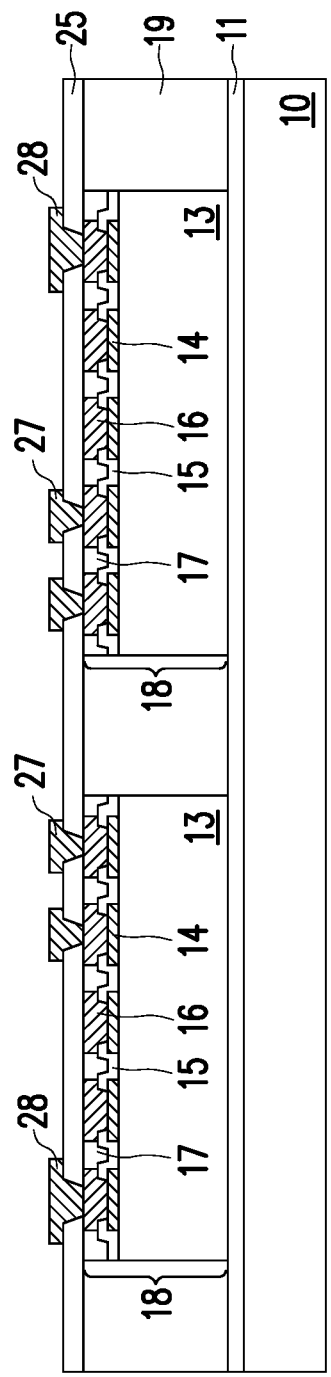

Referring to FIG. 1E, a plurality of conductive pads 27 and 28 are formed on the connectors 16 exposed by the openings OP1 and OP2 of the dielectric layer 25. For example, the conductive pads 27 are formed on the dielectric layer 25 and fills into the openings OP1 to be in physical and electrical contact with the connectors 16 of the dies 18. The conductive pads 28 are formed on the dielectric layer 25 and fills into the openings OP2 to be in physical and electrical contact with the connectors 16 of the dies 18. In other words, the conductive pads 27 and 28 penetrate through the dielectric layer 25 to electrically connect to the connectors 16 of the dies 18. In some embodiments, the conductive pads 27 and 28 include conductive materials. The conductive materials include metal such as copper, nickel, titanium, a combination thereof or the like. In some embodiments, the conductive pads 27 and 28 may respectively include a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

In some embodiments, the conductive pads 27 and 28 may be formed by the following processes: after the openings OP1 and OP2 are formed in the dielectric layer 25, a seed material layer is formed on the dielectric layer 25 to cover the top surface of the dielectric layer 25 and lines the surface of the openings OP1 and OP2 through, for example, a physical vapor deposition process such as a sputtering process. A patterned mask layer is then formed on the seed material layer, the patterned mask layer has a plurality of openings exposing the seed material layer in the openings OP1 and OP2 and a portion of the seed material layer on the top surface of the dielectric layer 25. Thereafter, a conductive layer is formed on the seed material layer exposed by the patterned mask layer. Afterwards, the patterned mask layer is removed by a suitable process such as an ashing process, the seed material layer previously covered by the patterned mask layer is removed by an etching process with the conductive layer as an etching mask, and the seed layer underlying the conductive layer is remained. As such, the conductive layer and the underlying seed layer form the conductive pads 27 and 28.

Figure 1F:
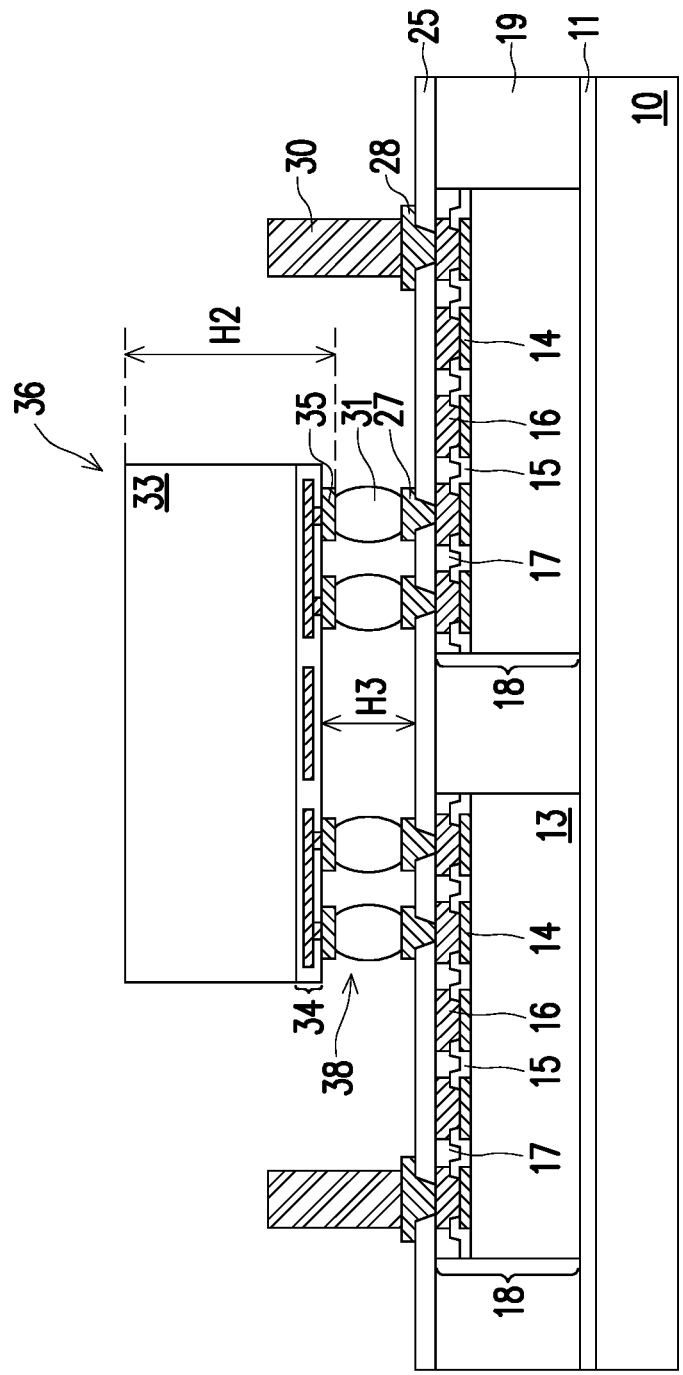

Referring to FIG. 1F, a plurality of conductive posts 30 are formed on and electrically connected to the conductive pads 28. In some embodiments, the conductive posts 30 will be encapsulated by and penetrate through an encapsulant formed in subsequent processes, and therefore, the conductive posts 30 may be referred to as a through integrated fan-out vias (TIVs) 30. The TIVs 30 include conductive materials such as copper, nickel, solder, alloys thereof, or the like, or a combination thereof. In some embodiments, the TIV 30 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

Still referring to FIG. 1F, in some embodiments, a bridge die 36 is electrically bonded to the conductive pads 27, and further electrically connected to the connectors 16 of the dies 18 through the conductive pads 27, such that some connectors 16 of the dies 18 are electrically connected to each other through the bridge die 36. In some embodiments, the bridge die 36 is bonded to the conductive pads 27 through a plurality of connectors 31, such as solder bumps, gold bumps, copper bumps, or the like or any other suitable metallic balls.

In some embodiments, the bridge die 36 include a substrate 33, an interconnection structure 34 and a plurality of pads 35 over the substrate 33. The substrate 33 may include materials the same as or different from those of the substrate 13 of the die 18. In some embodiments, the substrate 33 may be a semiconductor substrate, a polymer substrate, a dielectric substrate, a ceramic substrate, the like, or a combination thereof. The semiconductor substrate is, for example, a doped silicon substrate, an undoped silicon substrate or a semiconductor-on-insulator (SOI) substrate. The doped silicon substrate may be P-type doped, N-type doped, or a combination thereof.

The interconnection structure 34 includes conductive features embedded in one or more dielectric layers. The conductive features include one or more layers of metal lines and conductive vias interconnected to each other. The pads 35 are electrically connected to the conductive features of the interconnection structure 34 and serve as an external connection of the bridge die 36. The pads 35 are electrically connected to the bonding pads 27 through the connectors 31 therebetween. The materials of the pads 35 and the conductive features of the interconnection structure 34 may respectively include metal, metal compound, metal alloy or a combination thereof, such as copper, aluminum, tantalum, tungsten, tantalum nitride, titanium nitride, alloys of tungsten, titanium or cobalt or an alloy made of nickel and polysilicon or a copper-aluminum alloy, the like or combinations thereof.

In some embodiments, the bridge die 36 may further include active devices, passive devices or a combination thereof. The active devices include transistors and/or diodes, for example. The passive devices may include capacitors, resistors, inductors, and/or the like. However, the disclosure is not limited thereto. The bridge die 36 may include any kind of devices, as long as the bridge die 36 electrically connect the dies 18 to each other. In some embodiments, no active or passive devices are included in the bridge die 36, and the bridge die 36 is a blank chip without any other function except for providing the electrical connection between the dies 18. In some embodiments, one bridge die 36 corresponds to two dies 18. For example, a plurality of bridge dies 36 may be disposed over the carrier 10, and each bridge die 36 corresponding to two dies 18. However, the disclosure is not limited thereto. It is understood that, the number of the dies 18 and the bridge die 36 shown in the figures are merely for exemplary illustration, and the disclosure is not limited thereto.

Still referring to FIG. 1F, in some embodiments, a bridge die 36 is bonded to the dies 18 before the subsequent encapsulation process, the bridge die 36 may be thick, and the sufficient thickness of the bridge die 36 may help to avoid warpage issue. For example, the height (i.e. thickness) H2 of the bridge die 36 may range from 100 μm to 775 μm or 300 μm to 775 μm. As illustrated in FIG. 1F, a space 38 is formed between the bottom surface of the bridge die 36 and the top surface of the dielectric layer 25. In some embodiments, the space 38 is a relative narrow small space. For example, the height H3 of the space 38 may range from 5 μm to 80 μm or less. In some embodiments, the connectors 31 are arranged in an array and spaced from each other within the space 38.

Figure 1G:
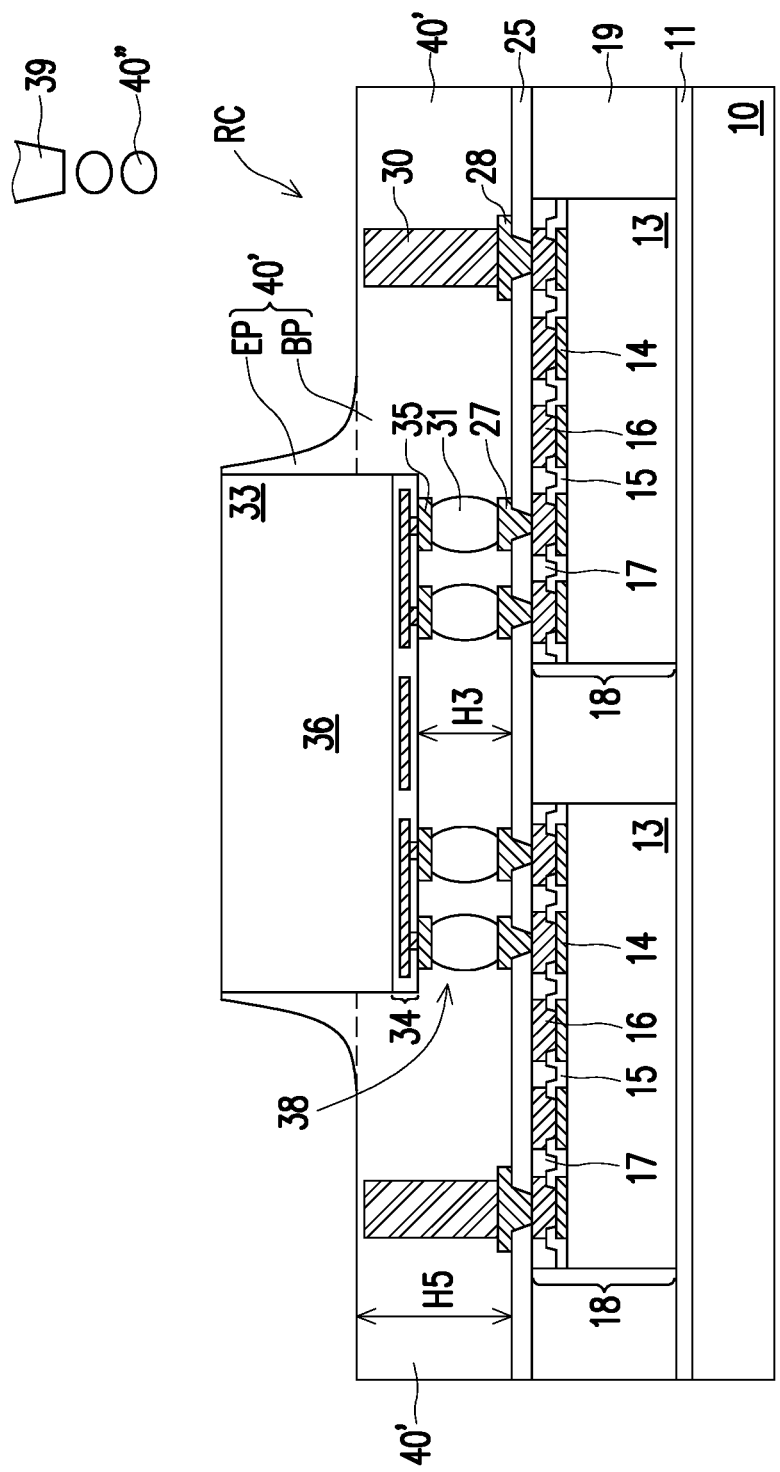

Referring to FIG. 1G, in some embodiments, an encapsulant material layer 40' is formed on the dielectric layer 25 by a dispensing process and a curing process. For example, a dispensing head 39 of a dispenser machine is placed over the carrier 10, and an encapsulant material 40" is dispensed onto the dielectric layer 25 in liquid form by the dispensing head 39, the encapsulant material 40" flows and spreads over the dielectric layer 25, and further flows into the space 38 underneath the bridge die 36 and around the connector 31 through capillary action. In some embodiments, the encapsulant material 40" includes a base material and a plurality of fillers in the base material, the base material is in liquid form, and the fillers are in solid form dispersed in the liquid base material, and the base material carries the fillers to flow over the dielectric layer 25. In some embodiments, the dispensing head 39 moves over the carrier 10 to dispense the encapsulant material 40" into different regions over the dielectric layer 25. In some embodiments, the dispensing head 39 moves along a single direction to avoid forming void in the resulted encapsulant material layer 40'. After the dispensing process is performed, a curing process is performed to cure the encapsulant material 40", so as to form the encapsulant material layer 40'. In some embodiments, the curing process is performed by at a temperature elevated from a lower temperature to a temperature range of 150° C. to 220° C. for about one or two hours. In some embodiments, a plasma treatment is further performed prior to the dispensing process, so as to clean the regions where the encapsulant material 40" will be dispensed.

In some embodiments, the encapsulant material layer 40' encapsulates sidewalls and top surfaces of the conductive pads 28, sidewalls and top surfaces of the TIVs 30, sidewalls of the bridge die 36 and fills into the space 38 between the bridge die 36 and the dielectric layer 25. In some embodiments, the encapsulant material layer 40' is formed to have a top surface higher than the top surface of the TIVs 30 and lower than the top surface of the die 36. For example, the top surfaces of the TIVs 30 are covered by the encapsulant material layer 40', while the top surface of the die 36 may be not covered by the encapsulant material layer 40' and exposed. The sidewalls of the die 36 may be completely covered by the encapsulant material layer 40'. However, the disclosure is not limited thereto. In some alternative embodiments, the encapsulant material layer 40' may cover a portion (e.g. lower portion and/or middle portion) of the sidewall of the bridge die 36, and the upper portion and/or the middle portion of the sidewall of the bridge die 36 may be exposed by the encapsulant material layer 40'. The top surface of the TIV 30 may also be exposed by the encapsulant material layer 40'. In some embodiments, as shown in FIG. 1G, the encapsulant material layer 40' formed by dispensing process has a non-flat surface, and the exposed upper surface of the encapsulant material layer 40' may be separated by the bridge die 36, that is, the exposed upper surface encapsulant material layer 40' is non-continuous.

In some embodiments, the thick bridge die 36 will be thinned in the subsequent process, and the height of the encapsulant material layer 40' can be controlled by the dispensing amount of the encapsulant material 40, therefore, it may be not necessary to make the encapsulant material layer 40' completely encapsulate sidewalls and top surfaces of the bridge die 36. Through dispensing process, the encapsulant material layer 40' may be formed with a smaller size (e.g. thickness, volume) than an encapsulant material formed by over-molding process, thereby saving the cost for the encapsulant material as well as the cost for the subsequent planarization process.

For example, as illustrated in FIG. 1G, the encapsulant material layer 40' may have a body portion BP and an extension portion EP. The thickness (i.e. height) H5 of the body portion BP of the encapsulant material layer 40' may range from 10 μm to 200 μm such as 80 μm. The top surface of the body portion BP is lower than the top surface of the bridge die 36 and may be higher than the top surface of the TIVs 30. The extension portion EP is located on the top surface of the body portion BP and on sidewalls of the bridge die 36. In some embodiments, the extension portion EP is formed by the encapsulant material extending up along the sidewalls of the bridge die 36 through capillary force during the dispensing process. The extension portion EP may extend up to the top of the bridge die 36 to cover the sidewalls of the bridge die 36 and have a top surface substantially coplanar with the top surface of the bridge die 36, that is, the encapsulant material layer 40' may completely cover the sidewalls of the bridge die 36. In some other embodiments, the extension portion EP may extend to a level height lower than the top surface of the bridge die 36, that is, the encapsulant material layer 40' may partially cover the sidewalls of the bridge die 36. The lateral thickness (i.e. width) of the extension portion EP may be non-uniform, such as decreased from bottom to top, and is much less than the width of the body portion BP. In other words, the encapsulant material layer 40' has recesses RC on the body portion BP and laterally aside the extension portion EP.

Figure 1H:
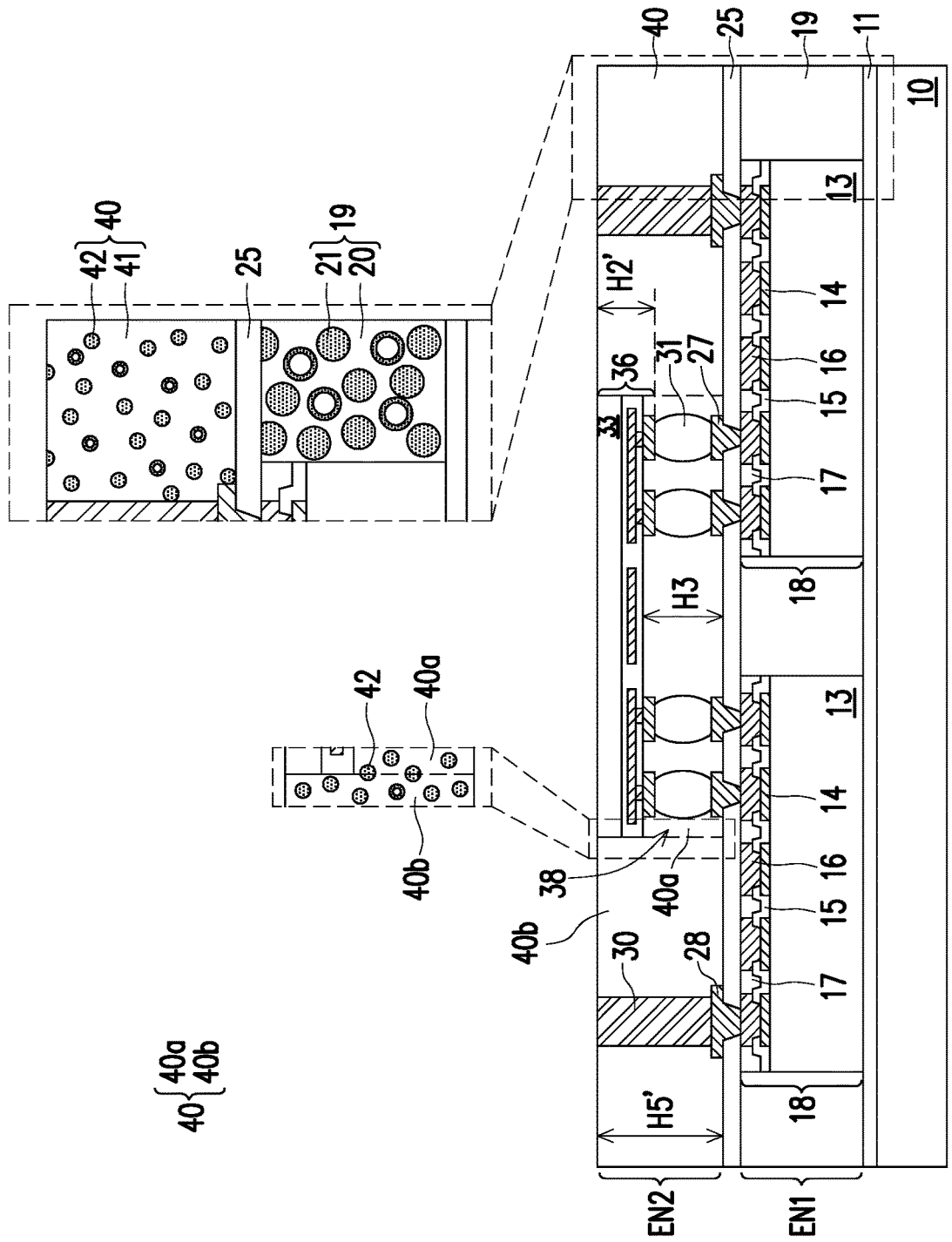

Referring to FIG. 1G to FIG. 1H, a planarization process is performed to planarize the top surfaces of the bridge die 36, the TIVs 30 and the encapsulant material layer 40', such that the top surfaces of the TIVs 30 are exposed, and an encapsulant 40 laterally encapsulating sidewalls of the bridge die 36 and the TIVs 30 is formed. The planarization process may include a grinding process, a chemical mechanical polishing (CMP) process or a combination thereof. In some embodiments, the planarization process removes a portion of the encapsulant material layer 40' and/or a portion of the die 36 and/or portions of the TIVs 30. In some embodiments, the extending portion EP and a portion of the body portion BP of the encapsulant material layer 40', the bridge die 36 covered by the extending portion EP and a portion of the bridge die 36 covered by the body portion BP and/or portions of the TIVs 30 are removed during the planarization process. In some embodiments, after the planarization process is performed, the top surface of the encapsulant 40, the top surfaces of the TIVs 30 and the top surface of the bridge die 36 are substantially coplanar with each other.

In other words, the bridge die 36 is thinned by the planarization process and has a reduced thickness. For example, the thinned bridge die 36 may have a height H2' ranging from 5 μm to 100 μm.

Referring to FIG. 1H, as such, an encapsulated semiconductor device is thus formed on the carrier 10. Specifically, a first encapsulated semiconductor device EN1 and a second encapsulated semiconductor device EN2 are formed on the carrier 10, and the dielectric layer 25 is sandwiched between the first encapsulated semiconductor device EN1 and the second encapsulated semiconductor device EN2. The first encapsulated semiconductor device EN1 includes the dies 18 encapsulated by the encapsulant 19. The second encapsulated semiconductor device EN2 includes the bridge die 36, the connectors 31 and the TIVs 30 encapsulated by the encapsulant 40.

In some embodiments, the material of the encapsulant 40 is different from the material of the encapsulant 19. The material of the encapsulant 40 may be referend to as molding underfill or underfill molding material. In some embodiments, different base material, different filler size and content and/or different additives may be used to form the encapsulant 40, such that the encapsulant 40 has a suitable property to provide the encapsulation for the bridge die 36 and/or the TIVs 30. For example, the encapsulant 40 includes a base material 41 and a plurality of fillers 42. The base material 41 may be resins, such as epoxy resins, phenolic resins or silicon-containing resins, anhydride/amine resin or the like. In some embodiments, the base material 41 of the encapsulant 40 and the base material 20 of the encapsulant 19 include different types of resins. For example, the base material 41 and the base material 20 may include resins having different types of anhydride/amine/phenol. Further, the encapsulant 40 and the encapsulant 19 may include different resin additives. The filler size and filler loading (density) of the encapsulant 40 may also be different from those of the encapsulant 19, such that the encapsulant 40 has different properties (e.g. CTE, Young's modulus, Tg, viscosity) than the encapsulant 19, the property differences will be described in detail below. The fillers 42 may include a single element, a compound such as nitride, oxide, or a combination thereof. The fillers 42 may include silicon oxide, aluminum oxide, boron nitride, alumina, silica, or the like, for example. The filler 42 may include solid fillers, hollow fillers, or a combination thereof. The shapes of the fillers 42 may be similar to those of the fillers 21. In some embodiments, the sizes and the content of the fillers 42 included in the encapsulant 40 are different from the sizes and the content of the fillers 21 included in the encapsulant 19. In some embodiments, suitable base material 41 are selected, and the sizes and the content of the fillers 42 are controlled within a suitable range, such that the encapsulant has a suitable physical property (such as, CTE, viscosity, Young's modulus).

In some embodiments, the filler size of the filler 42 is less than the filler size of the filler 19, and the average filler size of the fillers 42 is less than the average filler size of the fillers 21. The content of the fillers 42 in the encapsulant 40 is less than the content of the fillers 21 in the encapsulant 19. For example, the filler size (e.g. diameter), such as the maximum filler size of the filler 42 may be less than 10 μm. The average filler size (e.g. diameter) of the filler 42 may be in the range of 0.5 μm to 3 μm. In some embodiments, based on the total weight of the encapsulant 40, the content of the fillers 42 in the encapsulant 40 is about 60 wt % to 82 wt %. The filler size of the fillers 42 is selected to be at least less than the height H3 of the space 38, such that the fillers 42 can enter into the space 38 between the bridge die 36 and the dielectric layer 25. The filler content of the fillers 42 is controlled in the suitable range such that the encapsulant material 40" (FIG. 1G) has a suitable viscosity and sufficient fluidity to flow into the space 38 and also can stand without collapse. In some embodiments, the encapsulant 40 has a relative small thickness H5', such as 5 μm to 60 μm or thicker and the filler content of the fillers 42 may be relative small to reduce the viscosity of the encapsulant material 40", so as to guarantee the encapsulant material 40" has a sufficient fluidity, such that the base material 41 can carry the fillers 42 to flow into the space 38. In some embodiments, the viscosity of the encapsulant 40 is less than the viscosity of the encapsulant 19. For example, the viscosity of the encapsulant 40 ranges from 1 Pa·s to 80 Pa·s at room temperature, and less than 1 Pa·s at a temperature range of 50° C. to 100° C. Herein, the viscosity of the encapsulant refers to the viscosity of the encapsulant material used to form the encapsulant before the encapsulant material is cured.

In some embodiments, the CTE of the encapsulant 40 may be the same as or larger than the CTE of the encapsulant 19. For example, the CTE of the encapsulant 19 is 5 ppm/° C. to 30 ppm/° C. in a temperature range under glass transition temperature (Tg), and 25 ppm/° C. to 80 ppm/° C. in a temperature range higher than Tg. That is, there may exist a CTE mismatch between the encapsulant 40 and the encapsulant 19, or between the encapsulated semiconductor device EN2 and the encapsulated semiconductor device EN1. In some embodiments, the Young's modulus of the encapsulant 40 is less than the Young's modulus of the encapsulant 19. For example, the Young's Modulus of the encapsulant 40 ranges from 5 Gpa to 15 Gpa at room temperature. In the embodiments in which CTE mismatch exists between the encapsulated semiconductor device EN2 and the encapsulated semiconductor device EN1 (CTE of the encapsulated semiconductor device EN2 larger than the encapsulated semiconductor device EN1), the relative small Young's Modulus of the encapsulant 40 can help to reduce the warpage of the resulted package structure.

Still referring to FIG. 1H, the encapsulant 40 includes an under filling portion 40a and a lateral portion 40b connected to each other. The under filling portion 40a fills the space 38 under the bridge die 36, and between the bridge die 36 and the dielectric layer 25, and laterally surrounds the connectors 31. The lateral portion 40b is laterally aside the under filling portion 40a and the bridge die 36, and surrounding the TIVs 30. Since the encapsulant 40 including the under filling portion 40a and the lateral portion 40b is formed in a single encapsulation process, there is free of interface between the under filling portion 40a and the lateral portion 40b, and there is free of interface in the encapsulant 40. In some embodiments, the fillers 42 is substantially uniformly distributed throughout the encapsulant 40. In other words, the filler size (e.g. average size) and the filler content of the fillers 42 included in the under filling portion 40a is substantially the same as the filler size (e.g. average size) and the filler content of the fillers 42 included in the lateral portion 40b. In some embodiments, the under filling portion 40a and the lateral portion 40b share at least one fillers 42 (i.e. common filler), that is, at least one fillers 42 is located at both of the under filling portion 40a and the lateral portion 40b, but the disclosure is not limited thereto. In some embodiments, the components in the encapsulated semiconductor device EN2, such as the conductive pads 28 and the TIVs 30 around the bridge die 36 are completely encapsulated by and in contact with the encapsulant 40.

Figure 2:
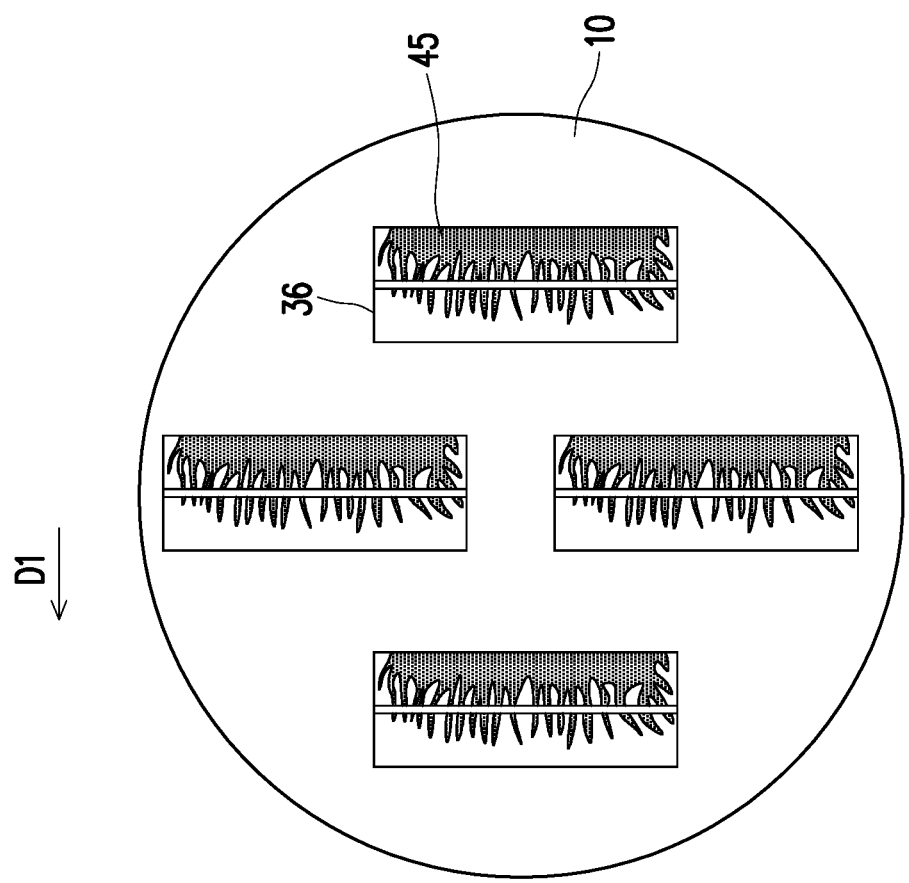
FIG. 2 schematically illustrates flow marks of an encapsulant from a top view according to some embodiments of the disclosure.

Referring to FIG. 2, in some embodiments, during the dispensing process for forming the encapsulant 40, the base material 41 carry the fillers 42 to flow into the space 38 to fill the gaps between the connectors 31, thereby forming a flow mark 45 in the resulted encapsulant 40. In some embodiments, the flow mark 45 is formed under the bridge die 36 where the connectors 31 are present, and the flow mark is not present at the position directly over the gap between the dies 18. FIG. 2 schematically illustrate a plurality of bridge dies 36 over the carrier 10 and flow marks 45 formed under different bridge dies 36. It is noted that, the number of the bridge dies 36 shown in FIG. 2 is merely for illustration, and the disclosure is not limited thereto. As shown in FIG. 2, in some embodiments, through dispensing process, the flow marks 45 of the encapsulant 40 under different bridge dies 36 in different region over the carrier 10 are substantially the same and extend toward substantially the same direction D1. In some embodiments, the image of the flow marks 45 may be obtained by a C-mode scanning acoustic microscope (C-SAM). For example, an electrical pulse signal is generated by a transmitter and pulser of the C-SAM, the electrical pulse signal is then transmitted into lead zirconate titanate (PZT) material of a transducer. An acoustic wave such as an ultrasound wave (mechanical wave) is generated through the vibration of the PZT material, and the acoustic wave penetrates into the target to be detected (which is the under filling portion 40a in the present embodiment), and a reflective signal is generated from the target and transmitted to an amplifier and then calculated and rebuilt to form the image of the target. In the present embodiments, the acoustic wave may be focus within the under filling portion 40a in any depth.

Figure 1I:
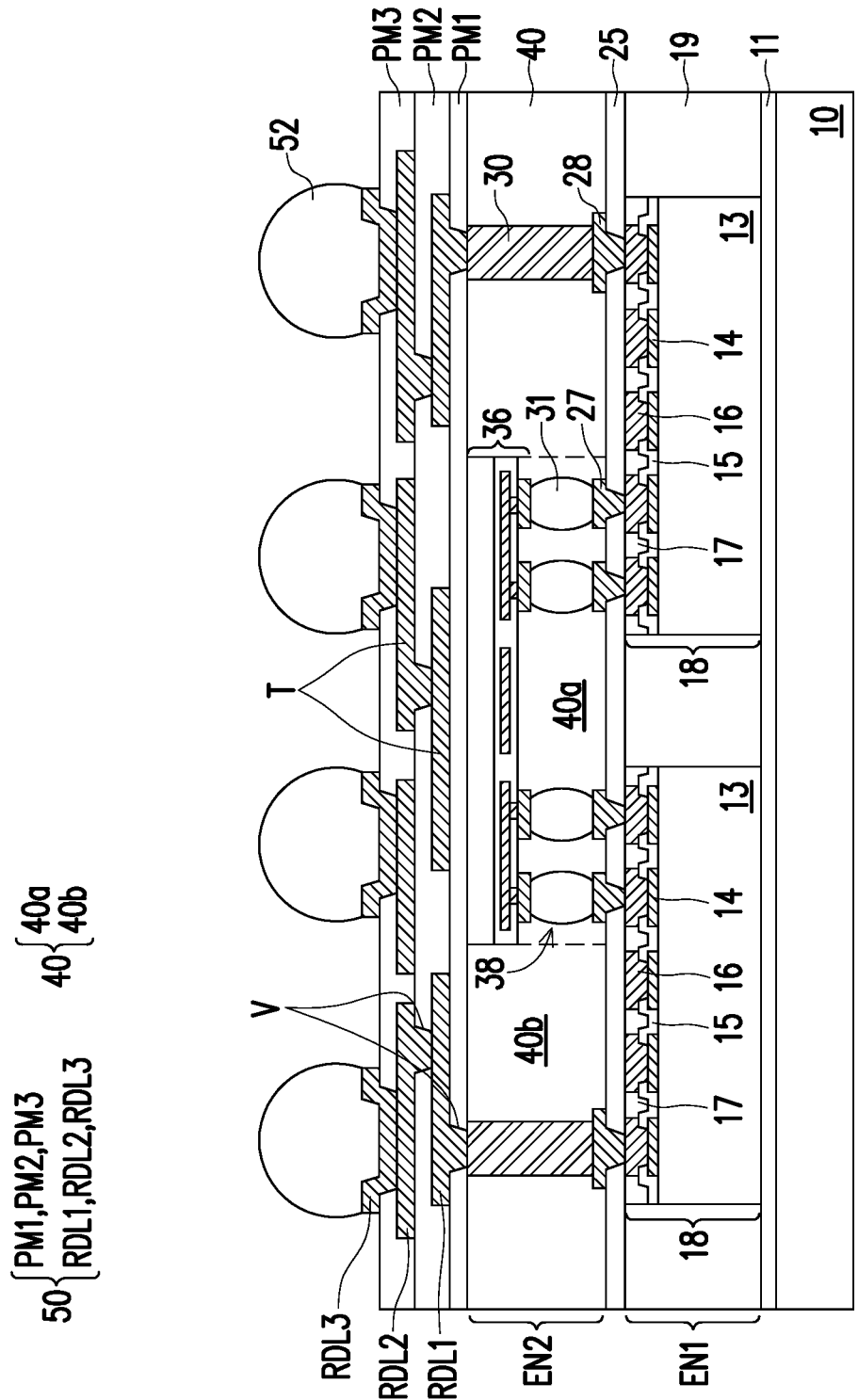

Referring back to FIG. 1H and FIG. 1I, in some embodiments, after the encapsulant 40 is formed, a redistribution layer (RDL) structure 50 is formed on the encapsulated semiconductor device EN2. In some embodiments, the RDL structure 50 includes a plurality of polymer layers PM1, PM2 and PM3 and a plurality of redistribution layers RDL1, RDL2 and RDL3 stacked alternately. The number of the polymer layers or the redistribution layers shown in FIG. 1I is merely for illustration, and the disclosure is not limited thereto. In some embodiments, more or less layers of polymer layers and redistribution layers are included in the RDL structure 50.

The redistribution layer RDL1 penetrates through the polymer layer PM1 and is electrically connected to the TIVs 30 and/or the bridge die 36. The redistribution layer RDL2 penetrates through the polymer layer PM2 and is electrically connected to the redistribution layer RDL1. The redistribution layer RDL3 penetrates through the polymer layer PM3 to electrically connect to the redistribution layer RDL2.

In some embodiments, the material of the polymer layer PM1, PM2, PM3 may respectively include polybenzoxazole (PBO), polyimide (PI), benzocyclobutene (BCB), a combination thereof or the like. The redistribution layers RDL1, RDL2, RDL3 respectively include conductive materials. The conductive materials include metal such as copper, nickel, titanium, a combination thereof or the like. In some embodiments, the redistribution layers RDL1, RDL2, RDL3 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

In some embodiments, the redistribution layers RDL1 and RDL2 respectively includes vias V and traces T connected to each other. The vias V of the redistribution layer RDL1 penetrates through the polymer layer PM1 to connect the traces T to the TIVs 30. The vias V of the redistribution layer RDL2 penetrates through the polymer layer PM2, to connect the traces T of the redistribution layers RDL2 and RDL1. The traces T are respectively located on the polymer layers PM1 or PM2, and are respectively extending on the top surface of the polymer layers PM1 or PM2. The sidewalls of the vias V and the traces T may be straight or inclined. In some embodiments, the via V has inclined sidewall and is tapered toward the encapsulated semiconductor device EN2.

Still referring to FIG. 1I, in some embodiments, the redistribution layer RDL3 is the topmost redistribution layer of the RDL structure 36, and may be referred to as under-ball metallurgy (UBM) layer for ball mounting. A plurality of connectors 52 are formed over and electrically connected to the redistribution layer RDL3 of the RDL structure 50. In some embodiments, the connectors 52 are referred to as conductive terminals. In some embodiments, the connectors 52 may be ball grid array (BGA) connectors, solder balls, controlled collapse chip connection (C4) bumps, or a combination thereof. In some embodiments, the material of the connector 52 includes copper, aluminum, lead-free alloys (e.g., gold, tin, silver, aluminum, or copper alloys) or lead alloys (e.g., lead-tin alloys). The connector 52 may be formed by a suitable process such as evaporation, plating, ball dropping, screen printing and reflow process, a ball mounting process or a C4 process. In some embodiments, metal posts or metal pillars (not shown) may further be formed between the redistribution layer RDL2 and the connectors 38, but the disclosure is not limited thereto. The connectors 52 are electrically connected to the TIVs 30 through the RDL structure 50, and further electrically connected to the dies 18 through the TIVs 30. The dies 18 are interconnected to each other through the bridge die 36 and the RDL structure 50.

Figure 1J:
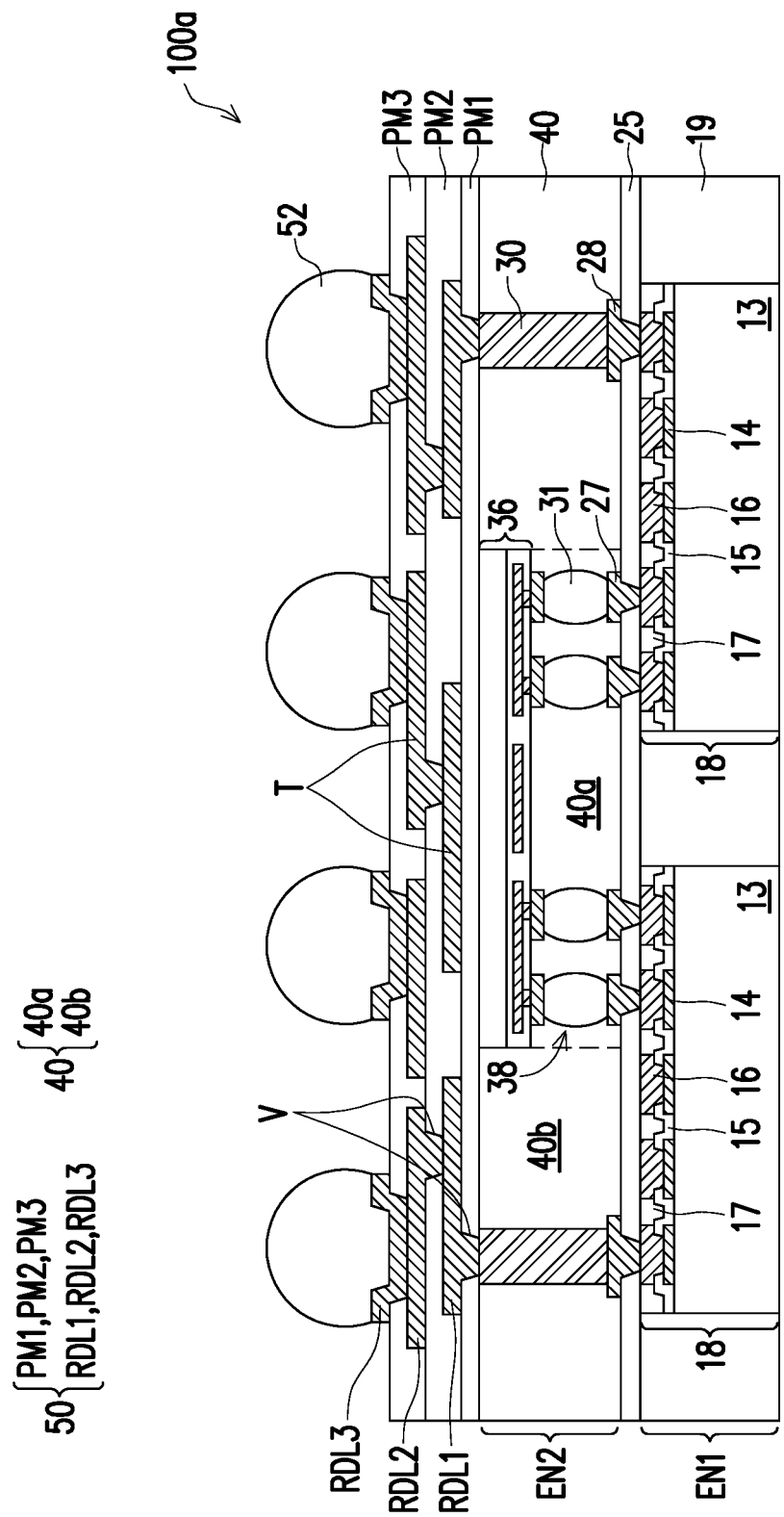

Referring to FIG. 1I and FIG. 1J, the de-bonding layer 11 is decomposed under the heat of light, and the carrier 10 is then released from the overlying structure. In some embodiments, thereafter, a singulation process is performed to separate the package structures, and a plurality of singulated package structure as shown in FIG. 1J are formed.

Referring to FIG. 1J, a package structure 100a is thus completed. The package structure include the encapsulated semiconductor device EN1, the dielectric layer 25, the conductive pads 27 and 28, the encapsulated semiconductor device EN2, the RDL structure 50 and the conductive terminals 52. The bridge die 36 and the RDL structure 50 provide the electrical connection between the dies 18. For example, some of the connectors 16 of the dies 18 are connected to each other through the bridge die 36, and some other connectors 16 of the dies 18 are connected to each other through the TIVs 30 and RDL structure 50. Although two TIVs 30 are illustrated, the disclosure is not limited thereto. More TIVs 30 may be included in the package structure 100a. In some embodiments, except for the connectors 16 connected to bridge die 36, some or all of the other connectors 16 of the die 18 may be connected to corresponding TIVs 30. In the embodiments of the disclosure, since some of the connectors of the dies are connected through the bridge die, the number of the layers of the redistribution layers and the pitch of the traces T of the RDLs of the RDL structure may be reduced. In some embodiments, the pitch of the traces of the RDL structure 50 is larger than the pitch of the metal lines included in the interconnection structure of the bridge die 36.

In the package structure 100a, the substrate 33 of the bridge die 36 is in physical contact with the polymer layer PM1 of the RDL structure 50, and there may be free of direct electrical connection between the redistribution layer RDL1 and the bridge die 36, but the disclosure is not limited thereto.

Figure 3:
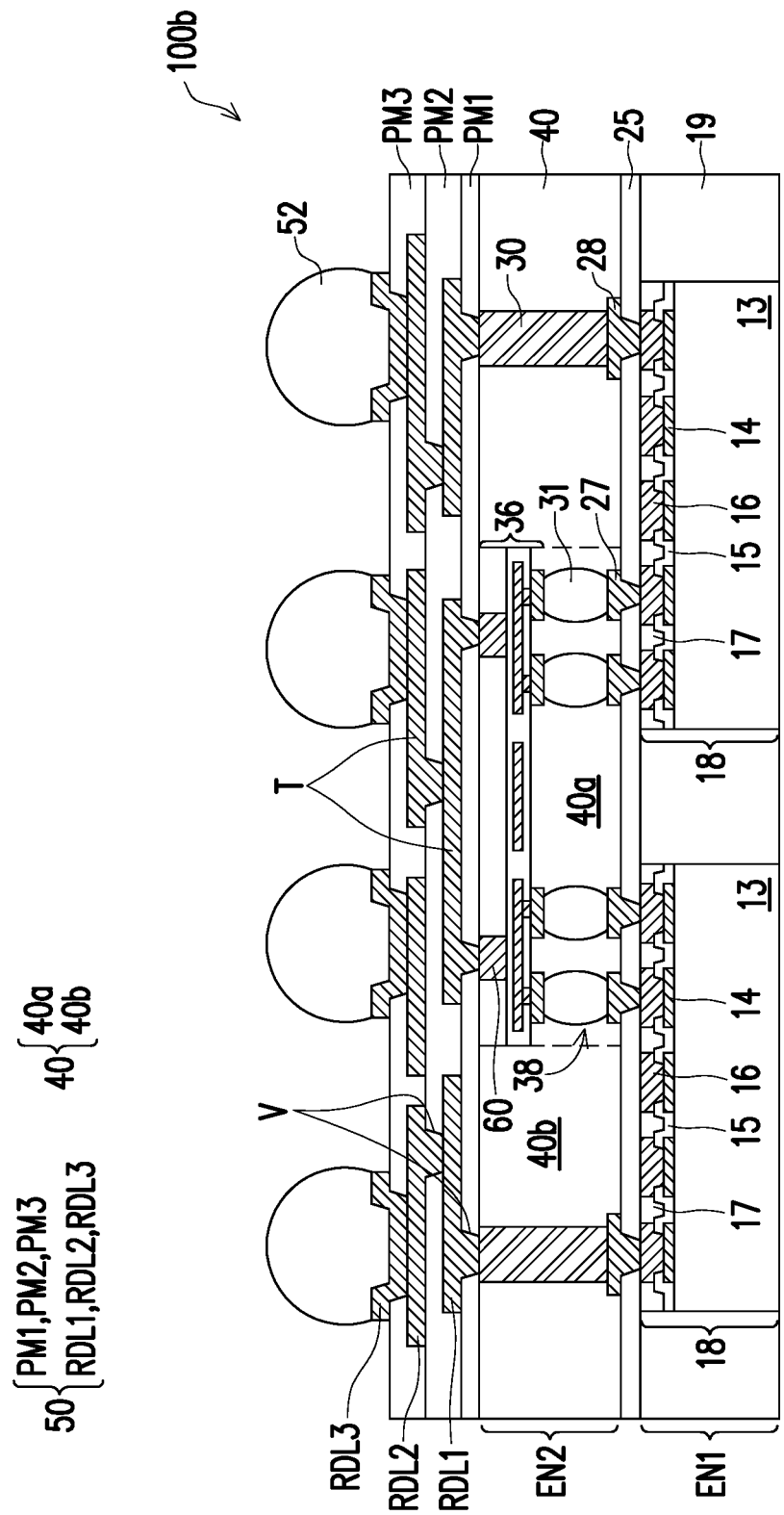
FIGS. 3 and 4 are schematic cross-sectional views illustrating package structures according to some embodiments of the disclosure.

Referring to FIG. 3, a package structure 100b is illustrated. The package structure 100b is similar to the package structure 100a, except that the bridge die 36 further includes a plurality of through substrate vias (TSVs) 60 disposed in the substrate 33 of the bridge die 36. The material of the TSVs 60 may be similar to those of the metal features included in the interconnection structure 34. The TSVs 60 are electrically connected to the interconnection structure 34. In some embodiments, the TSVs 60 are embedded in the substrate 33, and may be exposed by the planarization process illustrated in FIG. 1H. In some embodiments, in the package structure 100b, the top surfaces of the TSVs 60 are substantially coplanar with the top surface of the substrate 33 and the top surfaces of the TIVs 30 and the encapsulant 40. The redistribution layer RDL1 further includes vias landing on the TSVs 60. That is, the redistribution layer RDL1 is in physical and electrical contact with the TSVs 60. The other features of the package structure 100b are substantially the same as those of the package structure 100a, which are not described again here.

Figure 4:
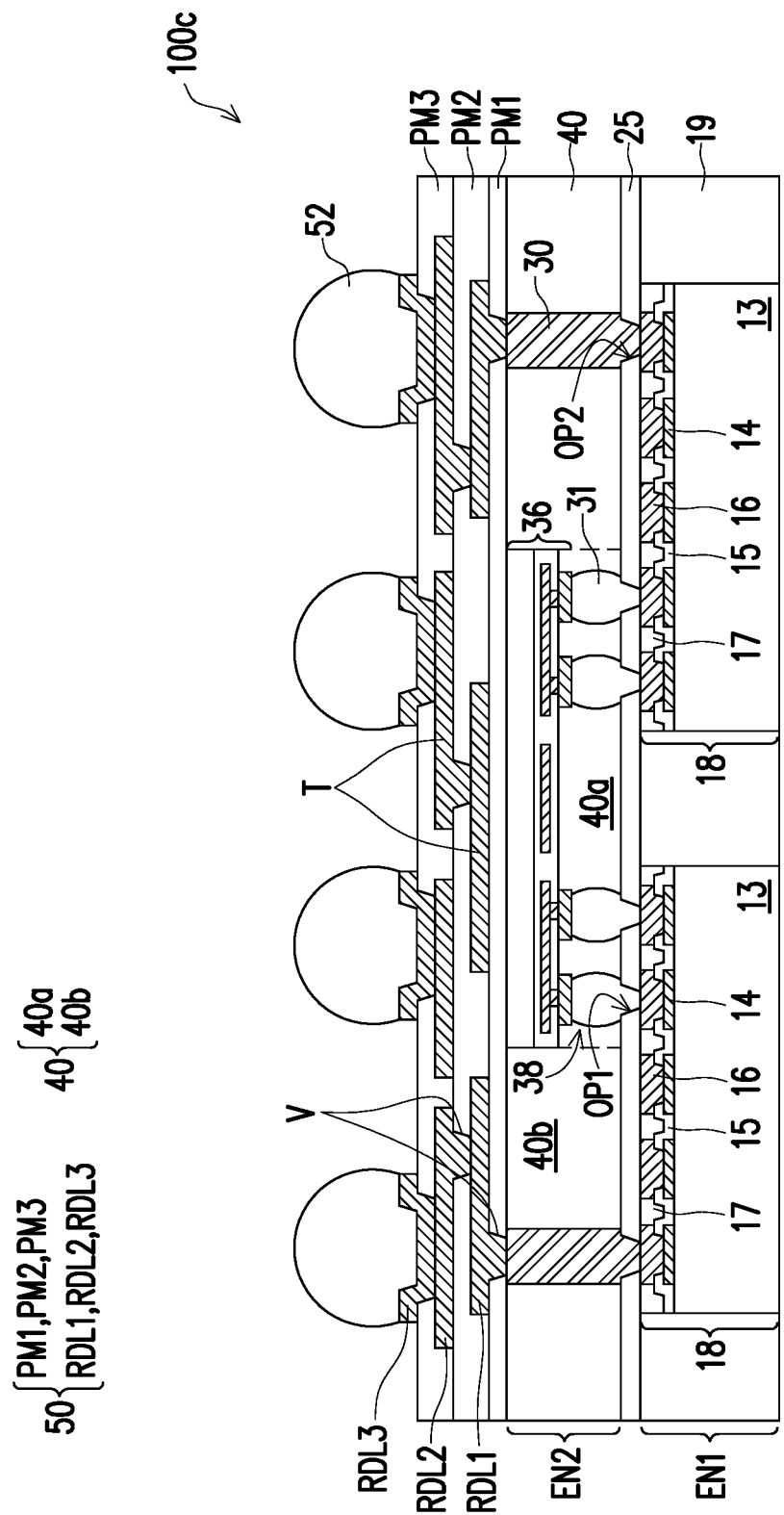

FIG. 4 illustrates a package structure 100c according to some other embodiments of the disclosure. The package structure 100c is similar to the package structure 100a, except that the package structure 100c is free of the conductive pads 27 and 28.

Referring to FIG. 4, in some embodiments, the TIVs 30 and the connectors 31 penetrate through the dielectric layer 25 to connect to the connectors 16 of the dies 18. For example, after the openings OP1 and OP2 are formed in the dielectric layer 25 (FIG. 1D), the process of forming the conductive pads 27 and 28 (FIG. 1E) is skipped. The TIVs 30 fills in the openings OP2 to be in electrical and physical contact with the connectors 16 of the die 18, so as to provide the electrical connection between the dies 18 and the subsequently formed RDL structure 50. The connectors 31 fills in the openings OP1 to be in electrical and physical contact with the connectors 16 of the die 18, so as to provide the electrical connection between the bridge die 36 and the dies 18. The other features of the package structure 100c are substantially similar to those of the package structure 100a. It is understood that the bridge die 36 of the package structure 100c may also include the TSV shown in FIG. 3.

In the embodiments of the disclosure, the encapsulant encapsulating the bridge die is formed of a single material and formed by a single encapsulation process. Therefore, the process steps are reduced, and the process flow is relative simplified, thereby saving the cost and improving the yield. In addition, since single material is used to severs as the under filling portion and the lateral portion of the encapsulant, there is no need to set the keep out zone around the die, and the corresponding issue is avoided accordingly.

In accordance with some embodiments of the disclosure, a package structure including a first die, a second die, a first encapsulant, a bridge die, and a second encapsulant are provided. The first encapsulant laterally encapsulates the first die and the second die. The bridge die is electrically connected to the first die and the second die. The second encapsulant is located over the first die, the second die and the first encapsulant, laterally encapsulating the bridge die and filling a space between the bridge die and the first die, between the bridge die and the first encapsulant and between the bridge die and the second die. A material of the second encapsulant is different from a material of the first encapsulant.

In accordance with alternative embodiments of the disclosure, a package structure including a first die, a second die, a first encapsulant, a dielectric layer, a bridge die and a second encapsulant is provided. The first encapsulant laterally encapsulates the first die and the second die. The dielectric layer covers top surfaces of the first die, the second die and the first encapsulant. The bridge die is located over the dielectric layer and electrically connected to the first die and the second die through a plurality of connectors. The second encapsulant is located on the dielectric layer, encapsulating the bridge die and the plurality of connectors. The second encapsulant includes an under filling portion disposed between the bridge die and the dielectric layer, and a lateral portion laterally aside the bridge die and the under filling portion, there is free of interface between the under filling portion and the lateral portion of the second encapsulant.

In accordance with some embodiments of the disclosure, a method of manufacturing a package structure includes the following processes. A first die and a second die are provided. A first encapsulant is formed to laterally encapsulate the first die and the second die. A dielectric layer is formed to cover top surfaces of the first die, the second die and the first encapsulant. A bridge die is disposed over the dielectric layer and electrically connected to the first die and the second die. A second encapsulant is formed on the dielectric layer to encapsulate the bridge die and the plurality of connectors. The second encapsulant includes an under filling portion disposed between the bridge die and the dielectric layer, and a lateral portion laterally aside the bridge die and the under filling portion, there is free of interface between the under filling portion and the lateral portion of the second encapsulant.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
    a first die and a second die laterally aside the first die;
    a first encapsulant, laterally encapsulating the first die and the second die;
    a third die, electrically connected to the first die and the second die; and
    a second encapsulant over the first die, the second die and the first encapsulant, laterally encapsulating the third die,
    wherein the first encapsulant comprises a plurality of first fillers, the second encapsulant comprises a plurality of second fillers, and a content of the second fillers in the second encapsulant is less than a content of the first fillers in the first encapsulant.

2. The package structure of claim 1, wherein the average size of the second fillers is less than the average size of the first fillers.

3. The package structure of claim 1, further comprising a dielectric layer sandwiched between the second encapsulant and the first encapsulant, between the second encapsulant and the first die, and between the second encapsulant and the second die, wherein the top surfaces of the first die and the second die are in physical contact with the dielectric layer.

4. The package structure of claim 3, further comprising a plurality of conductive pads penetrating through the dielectric layer to connect to the first die and the second die, wherein the third die is electrically bonded to a first portion of the plurality of conductive pads through a plurality of connectors.

5. The package structure of claim 4, further comprising:
    a plurality of through vias penetrating through the second encapsulant to connect to the first die and the second die through a second portion the plurality of conductive pads; and
    a redistribution layer (RDL) structure on the third die, the second encapsulant and the plurality of through vias, wherein the RDL structure connect to the first die and the second die through the plurality of through vias and the second portion the plurality of conductive pads.

6. The package structure of claim 3, wherein the third die is electrically connected to the first die and the second die through a plurality of connectors, and the plurality of connectors penetrate through the dielectric layer to connect to the first die and the second die.

7. The package structure of claim 6, further comprising:
    a plurality of through vias penetrating through the second encapsulant; and
    a redistribution layer (RDL) structure on the third die, the second encapsulant and the plurality of through vias, wherein the RDL structure connect to the first die and the second die through the plurality of through vias.

8. A package structure, comprising:
    a first die and a second die laterally aside the first die;
    a first encapsulant, laterally encapsulating the first die and the second die;
    a third die electrically connected to the first die and the second die;
    a second encapsulant over the first die, the second die and the first encapsulant, laterally encapsulating the third die,
    wherein the first encapsulant comprises a first base material and a plurality of first fillers in the first base material, the second encapsulant comprises a second base material and a plurality of second fillers in the second base material, and
    a Young's modulus of the second encapsulant is less than a Young's modulus of the first encapsulant,
    wherein a content of the second fillers in the second encapsulant is less than a content of the first fillers in the first encapsulant.

9. The package structure of claim 8, wherein a thermal expansion coefficient (CTE) of the second encapsulant is larger than a CTE of the first encapsulant.

10. The package structure of claim 8, wherein an average size of the plurality of second fillers is less than an average size of the plurality of first fillers.

11. The package structure of claim 8, further comprising
    a dielectric layer, located between the first encapsulant and the second encapsulant, between the first die and the second encapsulant, the first encapsulant and the third die, and the second die and the second encapsulant; and
    a plurality of conductive pads penetrating through the dielectric layer to electrically connect to the first die and the second die, and a plurality of connectors are landing on a first portion of the plurality of conductive pads.

12. The package structure of claim 11, further comprising:
    a plurality of through vias penetrating through the second encapsulant to connect to the first die and the second die through a second portion the plurality of conductive pads; and
    a redistribution layer (RDL) structure on the third die, the second encapsulant and the plurality of through vias, wherein the RDL structure connect to the first die and the second die through the plurality of through vias and the second portion the plurality of conductive pads.

13. The package structure of claim 11, wherein the second encapsulant comprises an under filling portion disposed between the third die and the dielectric layer, and a lateral portion laterally aside the third die and the under filling portion; and
    the under filling portion and the lateral portion share at least one second filler of the plurality of second fillers.

14. The package structure of claim 11, wherein the second encapsulant comprises an under filling portion disposed between the third die and the dielectric layer, and a lateral portion laterally aside the third die and the under filling portion, and there is free of interface between the under filling portion and the lateral portion of the second encapsulant.

15. A package structure, comprising:
a first die and a second die laterally aside the first die;
a first encapsulant, laterally encapsulating the first die and the second die;
a third die electrically connected to the first die and the second die;
a second encapsulant over the first die, the second die and the first encapsulant, laterally encapsulating the third die,
wherein the first encapsulant comprises a plurality of first fillers, the second encapsulant comprises a plurality of second fillers, and
a coefficient of thermal expansion (CTE) of the second encapsulant is substantially the same as or larger than a CTE of the first encapsulant,
wherein an average size of the plurality of second fillers is less than an average size of the plurality of first fillers,
wherein a content of the second fillers in the second encapsulant is less than a content of the first fillers in the first encapsulant.

16. The package structure of claim 15, further comprising:
a redistribution layer (RDL) structure on the third die and the second encapsulant, wherein the RDL structure is electrically connected to the first die and the second die.

17. The package structure of claim 16, wherein the RDL structure is electrically connected to the third die.

18. The package structure of claim 17, further comprising:
a plurality of first vias penetrating through the second encapsulant, electrically connecting the RDL structure and the first die, and electrically connecting the RDL structure and the second die; and
a plurality of second vias penetrating through a substrate of the third die, and electrically connecting the RDL structure.

19. The package structure of claim 18, further comprising a dielectric layer sandwiched between the second encapsulant and the first encapsulant, between the second encapsulant and the first die, and between the second encapsulant and the second die, wherein the top surfaces of the first die and the second die are in physical contact with the dielectric layer.

20. The package structure of claim 18, further comprising a plurality of conductive pads penetrating through the dielectric layer to connect to the first die and the second die, wherein the third die is electrically bonded to a first portion of the plurality of conductive pads through a plurality of connectors, and the RDL structure connect to the first die and the second die through the plurality of through vias and a second portion the plurality of conductive pads.

* * * * *